(12) United States Patent
Lee et al.

(10) Patent No.: US 6,569,728 B2
(45) Date of Patent: May 27, 2003

(54) METHOD FOR MANUFACTURING A CAPACITOR FOR USE IN A SEMICONDUCTOR DEVICE

(75) Inventors: Tae-Hyeok Lee, Ichon-shi (KR); Seung-Woo Jin, Ichon-shi (KR); Hoon-Jung Oh, Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/939,781

(22) Filed: Aug. 28, 2001

(65) Prior Publication Data

US 2002/0025648 A1 Feb. 28, 2002

(30) Foreign Application Priority Data

Aug. 31, 2000 (KR) ........................................ 2000-51348

(51) Int. Cl.[7] ........................................... H01L 21/8238
(52) U.S. Cl. ..................... 438/210; 438/239; 438/240; 438/247; 438/251; 438/252; 438/381; 257/296; 257/297; 257/298; 257/299; 257/300; 257/301; 257/303
(58) Field of Search ................................ 438/210, 381, 438/239, 240, 247, 251, 252; 257/296–311

(56) References Cited

U.S. PATENT DOCUMENTS

| | | | | |
|---|---|---|---|---|
| 5,338,951 A | * | 8/1994 | Argos, Jr. et al. | 257/295 |
| 6,027,967 A | * | 2/2000 | Parekh et al. | 438/254 |
| 6,201,276 B1 | * | 3/2001 | Agarwal et al. | 257/315 |
| 6,204,203 B1 | * | 3/2001 | Narwankar et al. | 438/785 |
| 6,303,434 B1 | * | 10/2001 | Parekh et al. | 438/254 |
| 6,303,455 B1 | * | 10/2001 | Hou et al. | 438/381 |

OTHER PUBLICATIONS

S. J. Wang et al., Effects of Poly Depletion On the Estimate of Thin Dielectric Lifetime., Electron Device Letters. vol. 12 No. 11.*
K. F, Schyegraf et al. Impact of Polysilicon Depletion in Thin Oxide MOS Technology. 1993 VLITSA. pp 86–89.*

* cited by examiner

Primary Examiner—Matthew Smith
Assistant Examiner—Belur Keshavan
(74) Attorney, Agent, or Firm—Jacobson Holman PLLC

(57) ABSTRACT

A method for forming a capacitor by stacking impurity-doped polysilicon layers having different concentrations to form a bottom electrode, treating surfaces of the bottom electrode to prevent a low dielectric constant material from being generated on the surface of the bottom electrode, and forming a dielectric layer and a top electrode on the bottom electrode.

17 Claims, 3 Drawing Sheets

METHOD FOR MANUFACTURING A CAPACITOR FOR USE IN A SEMICONDUCTOR DEVICE

FIELD OF THE INVENTION

The present invention relates to a method for forming a semiconductor capacitor and, more particularly, to a capacitor in a metal insulator silicon (MIS) structure.

DESCRIPTION OF THE PRIOR ART

Recently, a $Ta_2O_2$ layer has been used as a dielectric layer of a capacitor. A $Ta_2O_2$ material of a high dielectric constant has been substituted for a nitride oxide (NO) material in forming a semiconductor capacitor.

FIG. 1 is a cross-sectional view illustrating a conventional capacitor in a metal insulator silicon (hereinafter, referred to as a MIS) structure. A polysilicon layer is used as a bottom electrode of a semiconductor capacitor for a storage electrode 11, a metal layer is used as a top electrode for a plate electrode 13 and a $Ta_2O_2$ layer is used as a dielectric layer 12 between the storage electrode 11 and the plate electrode 13. As stated above, in the MIS structure, the polysilicon and metal layers are respectively used as the storage electrode 11 and the plate electrode 13 to overcome some difficulties in the metal electrode etching process and junction in a polysilicon substrate 10.

However, in the MIS structure, due to a difference in work function and resistance between the storage electrode and the plate electrode, electric characteristics of the capacitor have a lot of polarity according to a bias. That is, if a plus bias is applied to the storage electrode, a depletion layer to decrease the capacitance thereof is formed in the surface between the $Ta_2O_5$ layer and the storage electrode because the polysilicon layer is used as the storage electrode. Since the metal electrode has a larger work function than that of the polysilicon electrode, when a bias is applied to the plate electrode, electric characteristics of leakage current and an insulation destroying voltage deteriorate.

The decrease of capacitance, which is caused by the depletion layer, may be prevented by a high doping concentration in the polysilicon layer for the storage electrode. However, it is difficult to increase concentration of P more than $5\times10^{20}/cm^3$ based on the conventional doped polysilicon deposition. Further, an excessive injection of $PH_3$ into a reaction chamber to obtain a concentration of $1\times10^{21}/cm^3$ decreases the deposition rate, so a sufficient thickness of 200 Å or more may not be obtained and particles from anti-reacting sources causing an allied nuclei reaction may be generated.

Also, if a $Ta_2O_2$ layer is deposited on the storage electrode, a low dielectric constant layer, $SiO_2$, is formed on the polysilicon so that the capacitance of the capacitor is decreased.

To compensate for the above problems, a meta stable polysilicon (MPS) layer is employed on the storage electrode, but a low P concentration of the storage electrode is needed for the use of such a layer and, since the result is capacitance, then a capacitance difference to the bias, $\Delta C$, becomes greater. As described above, to use the MPS layer to increase the size of the capacitor, the P concentration of the storage electrode may be kept lower than $1\times10^{20}/cm^3$ and the capacitance decrease caused by the depletion layer has an amount of 15%~30%, compared to that with no depletion layer.

On the other hand, although a metal insulator metal (MIM) structure is also used, which uses the same metal layers in the storage electrode and the plate electrode, there are many difficulties in forming a storage electrode pattern.

SUMMARY OF THE INVENTION

It is, therefore, an object of the present invention to provide a method for forming a semiconductor capacitor which prevents the generation of a low dielectric constant layer and a capacitance decrease by a depletion layer and provides a capacitor with a high quality degree of integration.

In accordance with an aspect of the present invention, there is provided a method for forming a capacitor, the method comprising steps of a) stacking impurity-doped polysilicon layers which have a different concentration, thereby forming a bottom electrode; b) treating surfaces of the bottom electrode for preventing a low dielectric constant material from being generated on the surface of the bottom electrode; and c) forming a dielectric layer and a top electrode on the bottom electrode.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Hereinafter, a semiconductor capacitor according to the present invention will be described in detail referring to the accompanying drawings.

Figure 1:
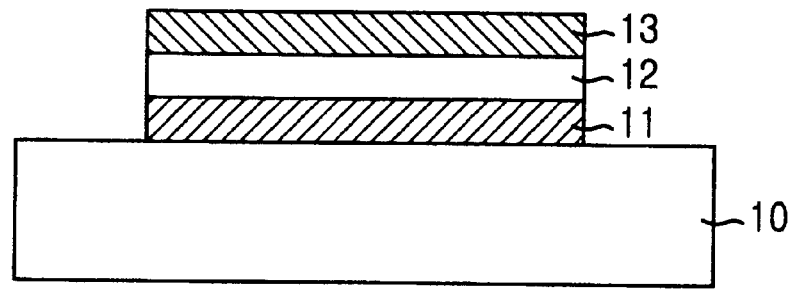
FIG. 1 is a cross-sectional view illustrating a conventional capacitor manufacturing method.
Figure 2:
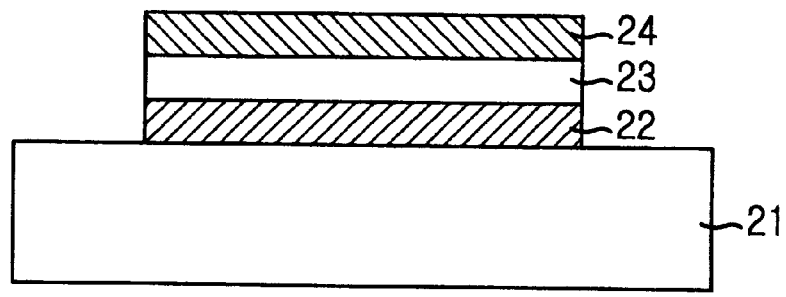
FIG. 2 is a cross-sectional view illustrating a capacitor manufacturing method in accordance with the present invention.

First, FIG. 2 is a cross-sectional view illustrating a capacitor manufacturing method in accordance with the present invention. As shown in FIG. 2, a storage electrode 22 which is a bottom electrode is formed on a semiconductor substrate 21, a $Ta_2O_6$ layer and a TaON layer are formed on the storage electrode 22 as a dielectric layer 23, and a plate electrode 24 which is a top electrode is formed on the dielectric layer 23. Here, the storage electrode 22 is formed with a multi polysilicon layer and the plate electrode 24 uses a metal layer, thereby forming a capacitor with the MIS structure.

Figure 3:
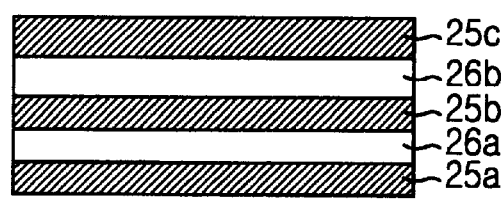
FIG. 3 is a cross-sectional view showing a structure of a multi polysilicon layer of FIG. 2 in accordance with a first embodiment of the present invention.

FIG. 3 is a cross-sectional view showing a structure of the multi polysilicon layer of FIG. 2 in accordance with a first embodiment of the present invention. A doped polysilicon layer having a plurality of polysilicon layers is deposited as the storage electrode 22. First polysilicon layers 25a, 25b and 25c at a P (phosphorous) concentration of $8\times10^{20}/$ $cm^3 \sim 1 \times 10^{22}/cm^3$ and second polysilicon layers 26a and 26b at a P concentration of $1 \times 10^{19}/cm^3 \sim 5 \times 10^{20}/cm^3$ are formed in turn by using the low pressure chemical vapor deposition (LPCVD) method, and then the multi polysilicon layer is formed in-situ. In other words, the doped polysilicon layers, each of which has a different concentration range of P, are alternately formed.

At this time, the first polysilicon layers 25a and 25c may be a bottom layer and a top layer respectively. The second polysilicon layer 26a is formed on the first polysilicon layer 25a, and then the first polysilicon layer 25b is formed on the polysilicon layer 26a in turn.

Figure 4:
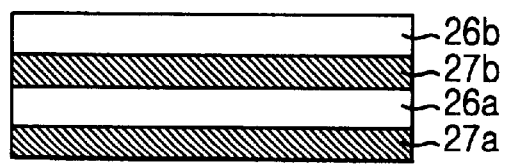
FIG. 4 is a cross-sectional view showing a structure of a multi polysilicon layer of FIG. 2 in accordance with a second embodiment of the present invention.

FIG. 4 is a cross-sectional view showing a structure of the multi polysilicon layer of FIG. 2 in accordance with the second embodiment of the present invention. A P-doped polysilicon layer 27a is formed to a thickness of 5 Å~50 Å by using a $PH_3$ gas as a reaction gas and the doped second polysilicon layer 26a is formed in turn on the P-doped layer 27a. Subsequently, a P-doped polysilicon layer 27b is formed on the doped second polysilicon layer 26a, and then the doped second polysilicon layer 26b is formed on the P-doped polysilicon layer 27b. The doped second polysilicon layer 26b may be a top layer at a thickness of 5 Å~50 Å.

Figure 5:
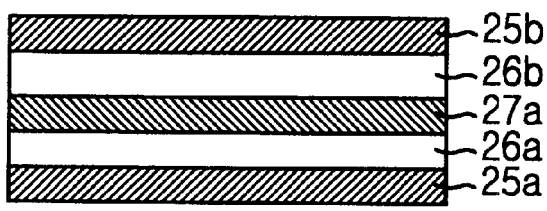
FIG. 5 is a cross-sectional view showing a structure of a multi polysilicon layer of FIG. 2 in accordance with a third embodiment of the present invention.

FIG. 5 is a cross-sectional view showing a structure of the multi polysilicon layer of FIG. 2 in accordance with the third embodiment of the present invention. The storage electrode has a stacked structure which is comprised of the first polysilicon layer 25a with a high P concentration, the second polysilicon layer 26a with low P concentration, the P-doped polysilicon layer 27a, the second polysilicon layer 26b and the first polysilicon layer 25b. As in the storage electrode which stacks up the first polysilicon layer 25a, the second polysilicon layer 26a, the P-doped polysilicon layer 27a and the second polysilicon layer 26b successively, the P-doped layer 27a is inserted between the second silicon layers 26a and 26b.

As described in the FIGS. 3 to 5, the storage electrode 22 is formed by a plurality of conducting layers, each of which has a different concentration of P, and a thermal treatment is carried out.

After alternately depositing the first polysilicon layers 25a, 25b and 25c with a high P concentration and the second polysilicon layers 26a and 26b with a low P concentration to increase the P concentration deposition in the storage electrode 22, or inserting the P-doped polysilicon layer between the two second polysilicon layers which have a low P concentration, the thermal treatment is carried out so that the whole storage electrode 22 maintains an even and high concentration of $8 \times 10^{20}/cm^3$.

At this time, to prevent a depletion layer from being generated between a surface of the storage electrode 22 and the dielectric layer 23, the P concentration on the surface of the storage electrode 22 has to be higher than that of a bulk region within the storage region 22.

Then, a pretreatment using a cleaning gas or nitrogen gas is carried out to clean the surface of the storage electrode in the stacked structure and, based on this pretreatment, a passivation layer may be formed on the surface thereof and such a passivation layer may prevent a low dielectric constant layer, such as a $SiO_2$ layer or a SiON layer, from being generated on the surface of the storage electrode.

In the case where a $NH_3$ gas is used in the pretreatment, a nitride layer may be formed at a thickness of 3 Å~30 Å by the rapid thermal process at 650° C.–950° C., and in the case where $NH_3$, $N_2$ and $N_2O$ plasma are used, a nitride layer may be formed at a thickness of 3 Å~30 Å. Also, in the LPCVD method, a $Si_3N_4$ layer may be formed at a thickness of 3 Å~30 Å. The CVD method make a tantalum based dielectric, e.g., $Ta_2O_5$ and TaON, or after forming a top electric layer, e.g., PZT and SBT, the thermal treatment in the presence of an $O_2$ gas, at 700° C.–1000° C. may be carried out for crystallizing the dielectric layer 23 and for inducing P diffusion into the storage electrode 22.

A metal layer is formed on the dielectric layer 23 by using one of the TiN, WN, $RuO_2$, $IrO_2$ and Pt metals as the plate electrode 24, and the metal layer uses a metal of low resistivity. As described above, the nitrogen protective layers, in accordance with embodiments of the present invention, prevent a capacitance decrease caused by the depletion layer and a low dielectric constant layer, and without the MPS layer which increases the size of the capacitor, capacitance acquisition over 25 fF/cell is possible.

If the $Ta_2O_5$, which is the dielectric, is used in the MIS structure, the capacitance can be increased about 1.5 times because the dielectric rate is larger than that of $Si_3N_4$ by about 4~10 times so, without MPS, it is possible to obtain a sufficient capacitance.

As described above, the capacitor of the present invention increases the P concentration of the storage electrode to prevent the capacitance decrease caused by a depletion and thereby, increase a charge capacity by more than 20% and makes integration easier than with the MIM structure. Without using MPS, it is possible to obtain enough capacitance to reduce expenditure, increase yield and downsize the device.

While the present invention has been described with respect to the particular embodiments, it will be apparent to those skilled in the art that various changes and modifications may be made without departing from the scope of the invention as defined in the following claims.

What is claimed is:

1. A method for forming a capacitor, the method comprising steps of:
   a) stacking a plurality of first polysilicon layers with a high P (Phosphorous) concentration and a plurality of second polysilicon layers with a low P concentration alternately and wherein an uppermost layer of the stacked impurity-doped polysilicon layers is the first polysilicon layer, thereby forming a bottom electrode;
   b) treating surfaces of the bottom electrode to prevent a low dielectric constant material from being generated on the surfaces of the bottom electrode; and
   c) forming a dielectric layer and a top electrode on the bottom electrode.

2. The method of claim 1, wherein the bottom electrode is formed by using a low pressure chemical vapor deposition (LPCVD).

3. The method of claim 2, wherein the first polysilicon layer is doped at a P concentration of about $8 \times 10^{20}/cm^3 \sim 1 \times 10^{22}/cm^3$.

4. The method of claim 2, wherein the second polysilicon layer is doped at a P concentration of about $1 \times 10^{19}/cm^3 \sim 1 \times 10^{22}/cm^3$.

5. The method of claim 1, wherein the bottom electrode is formed by P-doped polysilicon layers.

6. The method of claim 5, wherein the polysilicon layer with low P concentration is doped at a P concentration of $1 \times 10^{19}/cm^3 \sim 5 \times 10^{20}/cm^3$.

7. The method of claim 1, wherein the bottom electrode is formed by stacking a first polysilicon layer with a high P concentration, a second polysilicon layer with a low P concentration, a P-doped polysilicon layer and a second polysilicon layer with a low P concentration, whereby the P-doped polysilicon layer is inserted between the two second polysilicon layers.

8. The method of claim 7, wherein the first polysilicon layer is doped at a P concentration of $8 \times 10^{20}/cm^3 \sim 1 \times 10^{22}/cm^3$.

9. The method of claim 7, wherein the second polysilicon layer is doped at a P concentration of $1 \times 10^{19}/cm^3 \sim 5 \times 10^{20}/cm^3$.

10. The method of claim 7, wherein the P-doped polysilicon layer is doped by a $PH_3$ gas.

11. The method of claim 1, further comprising a step d) of forming a passivation layer on the surfaces of the bottom electrode.

12. The method of claim 11, wherein the passivation layer is formed at a thickness of 3 Å~30 Å.

13. The method of claim 12, wherein the passivation layer is formed by a rapid thermal process by using a $NH_3$ gas.

14. The method of claim 12, wherein the passivation layer is formed by $NH_3$, $N_2$ and $N_2O$ plasma.

15. The method of claim 12, wherein the passivation layer is formed by a LPCVD method.

16. The method of claim 1, wherein the dielectric layer is any one selected from the group consisting of $Ta_2O_6$, TaON BST, PZT and SBT.

17. The method of claim 1, wherein the top electrode is any one selected from the group consisting of TiN, WN, $RuO_2$, $IrO_2$ and Pt metals.

* * * * *